310-322 SR

2/3/87 XR 4,641,054

United States Patent [19]

Takahata et al.

[11] Patent Number: 4,641,054

[45] Date of Patent: Feb. 3, 1987

[54] PIEZOELECTRIC ELECTRO-ACOUSTIC TRANSDUCER

[75] Inventors: Daisuke Takahata; Yukiyoshi Sakai, both of Kawashima, Japan

[73] Assignee: Nippon Ceramic Company, Limited, Saitama, Japan

[21] Appl. No.: 748,616

[22] Filed: Jun. 25, 1985

[30] Foreign Application Priority Data

| | | | |
|---|---|---|---|
| Aug. 9, 1984 | [JP] | Japan | 59-121408 |
| Nov. 15, 1984 | [JP] | Japan | 59-173522 |
| Dec. 19, 1984 | [JP] | Japan | 59-192425 |
| Dec. 21, 1984 | [JP] | Japan | 59-193720 |

[51] Int. Cl.[4] .............. H01L 41/08

[52] U.S. Cl. .............. 310/324; 310/322; 340/384 E; 381/190

[58] Field of Search .............. 310/322, 324; 179/110 A; 340/384 E

[56] References Cited

U.S. PATENT DOCUMENTS

| | | | |
|---|---|---|---|
| 3,745,384 | 7/1973 | Blanchard | 310/324 |
| 4,176,524 | 12/1979 | Kamiyama et al. | 310/324 X |
| 4,190,782 | 2/1980 | Guess | 310/324 |
| 4,190,783 | 2/1980 | Massa | 310/324 |
| 4,193,647 | 3/1980 | Guess | 310/324 |

*Primary Examiner*—Mark O. Budd

*Attorney, Agent, or Firm*—Wegner & Bretschneider

[57] ABSTRACT

A piezoelectric transducer is formed by fixedly laying a second oscillating plate over a first oscillating plate to which a piezoelectric oscillating assembly having a piezoelectric oscillating element is adhered, so as to define an acoustically sealed space. And, as the first oscillating plate oscillates by being driven by the oscillation of the piezoelectric oscillating assembly, the second oscillating plate oscillates by being driven thereby by way of the sealed space. Due to the shifting of the resonance frequencies of the piezoelectric oscillating assembly and the first and the second oscillating plates, and also due to the restriction of the oscillation by the sealed space, a wide frequency property is obtained, making this piezoelectric transducer particularly suitable for use as a speaker or as a microphone.

12 Claims, 21 Drawing Figures

PIEZOELECTRIC ELECTRO-ACOUSTIC TRANSDUCER

BACKGROUND OF THE INVENTION

1. Field of the Invention

The present invention relates to a piezoelectric transducer using a piezoelectric oscillating element as its driving means, and in particular relates to an improvement of such a piezoelectric transducer which is suitable for use as a piezoelectric loudspeaker, a piezoelectric microphone, a piezoelectric buzzer, and so on.

2. Description of the Prior Art

Conventionally, a piezoelectric transducer of this type has had a structure such as shown in longitudinal sectional view in FIG. 20 of the accompanying drawings.

Specifically, in this structure, a step portion 3 is formed at a longitudinally central portion of the interior of a tubular case 1 which has an open end, and a piezoelectric oscillating assembly 9 which is formed by adhering a piezoelectric oscillating element 5 (made of a per se known type of piezoelectric material) onto a surface of an electroconductive plate 7 of a circular shape is attached by its circular edge portion to the step portion 3 with elastic adhesive 11. Further, a sound emitting hole 13 is formed in the end surface of the case 1 which is not open, and a circuit board 15 having a drive circuit (which is not shown in the drawing) for driving the piezoelectric oscillating element 5 is mounted in the open end surface of the case 1, with wires which are also not shown in the figure being provided for electrically connecting the piezoelectric oscillating element 5 to said circuit board 15.

According to such a structure for a piezoelectric electro-acoustic transducer, when the piezoelectric oscillating element 5 is driven by the drive circuit, the piezoelectric oscillating assembly 9 is caused to oscillate by way of the oscillation of the piezoelectric oscillating element 5, and this causes the production of sound in the air filling the chamber 17 defined on the side of the piezoelectric oscillating assembly 9 towards the closed end of the casing 1 and the sound emitting hole 13, and this sound is thence emitted to the outside mainly through the sound emitting hole 13. Such a sound has frequency characteristics in which the sound level is high near the characteristic resonance frequency A of the piezoelectric oscillating assembly 9 and also near the characteristic resonance freqency B of the acoustic space or chamber 17. Such a frequency characteristic is exemplarily shown in FIG. 21 of the accompanying drawings as a graph of sound intensity against frequency.

Because the characterisic resonance frequency B may be changed by varying the shape and the volume of the acoustic space 17 by adjusting the shape of the case 1 and of the sound emitting hole 13, thus by bring the resonance frequency B of the chamber 17 near to the characteristic resonance frequency A of the piezoelectric oscillating assembly 9 it is conventionally considered to be possible to broaden the frequency range of high sound pressure level.

However, according to such a structure for a piezoelectric transducer, the adjustable factors are limited to the shape and the dimensions of the piezoelectric oscillating assembly 9 and of the case 1, and the characteristic resonance frequencies A and B are relatively steep and are few in number (i.e., two), and thus, even when the characteristic resonance frequency B is varied, it is not possible to broaden the frequency range of high sound pressure level, and further it is difficult to obtain a favorable sound pressure level over a wide frequency range.

Therefore, such a piezoelectric transducer is suitable for driving air, i.e. for producing a sound, at a certain substantially constant frequency, as in the case of a piezoelectric buzzer, but when it is to be driven by a signal the frequency of which varies over a wide range, as in the case of a loudspeaker, it is difficult to obtain a favorable sound pressure and to get crisp reproduction over a wide frequency range, and the reproduced sound tends to have a squeaky tone.

Moreover, because such a piezoelectric transducer has the above described structure in which the piezoelectric oscillating assembly 9 is secured within the tubular case 1, it is hard to make its configuration compact, and in particular it is hard to make said structure in particular low profiled (by which is meant short in longitudinal extent), while broadening its frequency range at the same time.

SUMMARY OF THE INVENTION

Accordingly, it is the primary object of the present invention to provide a piezoelectric transducer which has a wide frequency range property by using a simple structure.

It is a further object of the present invention to provide such a piezoelectric transducer which is both compact and low profiled, and which is built from a piezoelectric oscillating element and an oscillating plate, with the possibility of eliminating the requirement for a casing.

It is a further object of the present invention to provide such a piezoelectric transducer which is suitable for use as a loudspeaker or a microphone.

According to the most general aspect of the present invention, these and other objects are accomplished by a piezoelectric transducer comprising: (a) a piezoelectric oscillating assembly comprising a piezoelectric oscillating element comprising a thin piezoelectric plate and electrodes attached to the opposing surfaces of the thin piezoelectric plate; (b) a first oscillating plate, which is greater in diameter than the piezoelectric oscillating assembly, to which the piezoelectric oscillating assembly is adhered; and (c) a second oscillating plate, which is laid over the first oscillating plate with the edges thereof substantially sealed together so as to define an acoustically sealed space therebetween; (d) a support portion being defined by the aforethe laid over and sealed together portions of the first and the second oscillating plates, the edge portion of the support portion being defined by at least the edge portion of the first or the second oscillating plate.

According to such a structure according to the present invention, as will be explained hereinafter, it becomes possible to obtain a relatively wide frequency range property, and when such a piezoelectric transducer is used as a loudspeaker (for instance) it can reproduce a crisp sound and a favorable sound pressure level over a wide frequency range, while further achieving great simplicity and remarkable compactness, and in particular being of a low profiled structure.

BRIEF DESCRIPTION OF THE DRAWINGS

The present invention will now be shown and described with reference to the preferred embodiments thereof, and with reference to the illustrative drawings, which however are given for the purposes of explanation and exemplification only, and are not intended to be limitative of the scope of the present invention in any way. In the drawings, like parts and spaces and so on are denoted by like reference symbols in the various figures thereof; in the description, spatial terms are to be everywhere understood in terms of the relevant figure; and.

DESCRIPTION OF THE PREFERRED EMBODIMENTS

Figure 1:
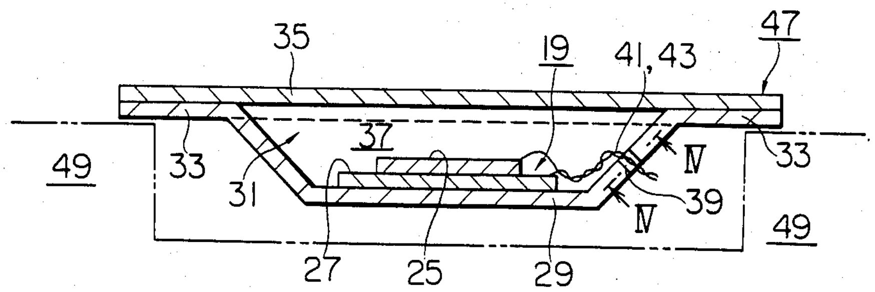
FIG. 1 is a longitudinal sectional view of a first preferred embodiment of the piezoelectric transducer according to this invention.
Figure 2:
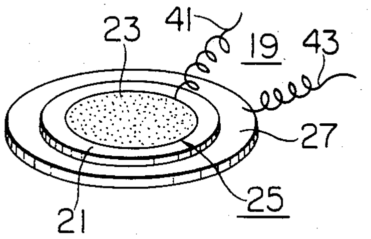
FIG. 2 is a perspective view of a piezoelectric oscillating assembly incorporated in the piezoelectric transducer shown in FIG. 1.

The present invention will now be described with reference to the preferred embodiments thereof, and with reference to the appended drawings. FIG. 1 relates to the first preferred embodiment, and shows, in longitudinal sectional view, a piezoelectric transducer incorporating a piezoelectric oscillating assembly 19 which is formed by adhering a piezoelectric oscillating element 25, having a pair of circular disk shaped electrodes 23 (only one is shown in the drawings) fitted on the opposing plane circular surfaces of a piezoelectric plate 21 also of a circular disk shape, to an electroconductive plate 27 which is likewise of a circular disk shape and is greater in diameter than the piezoelectric oscillating element 25, in such a manner that one of said electrodes (the one which is not shown) comes in contact therewith. This piezoelectric oscillating assembly 19 is shown in perspective view in FIG. 2.

This piezoelectric oscillating assembly 19 is adhered to the internal bottom surface of a depression 31 formed in a central portion of a first oscillating plate 29 of a circular shape which is greater in diameter than the piezoelectric oscillating assembly 19 and is made of a thin plastic film having a thickness of the order of 0.1 mm for instance. This depression 31 is shaped like a frustrum of a cone with a wide apical angle, and diverges towards its open end, and a surrounding edge portion of the first oscillating plate 29 forms a flange 33 around the edge of the depression 31. The general outer configuration of this first oscillating plate 29 is shown in perspective view in FIG. 3.

A second oscillating plate 35 which is likewise circular in shape and is likewise made of a thin plastic film is attached over the first oscillating plate 29 so as to cover the depression 31, and is fixedly secured to the aforementioned flange 33 of said first oscillating plate 29. As a result, the depression 31 of the first oscillating plate 29 is sealed and defines a substantially sealed space 37 between the first and second oscillating plates 29 and 31.

Figure 3:
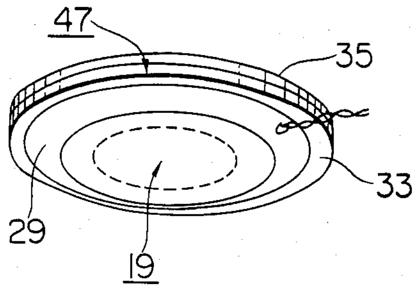
FIG. 3 is a perspective view of the piezoelectric transducer shown in FIG. 1.
Figure 4:
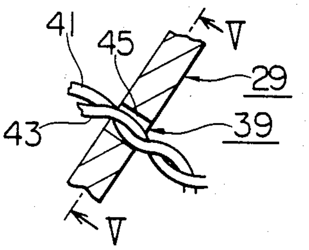
FIG. 4 is a sectional view taken in a plane indicated in FIG. 1 by the arrows IV—IV for illustrating the structure in the piezoelectric transducer of FIG. 1 for leading out the lead wires to the outside.
Figure 5:
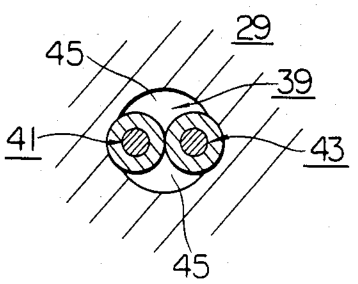
FIG. 5 is a sectional view, taken in a plane indicated in FIG. 4 by the arrows V—V, for showing in more detail the structure for leading out the lead wires in FIG. 4.

The first oscillating plate 29 is provided with an insertion hole 39 which communicates the substantially sealed space 37 with the outside. Through this insertion hole 39, a pair of lead wires 41, 43 extending from the electroconductive plate 27 and from the one of the electrodes 23 of the piezoelectric oscillating element 25 not contacted to said electroconductive plate 27 (the one which is visible in FIG. 2) are passed, and are led out to the outside as shown in FIG. 3 and in the sectional view of FIG. 4, and these lead wires 41 and 43 are connected to a drive circuit which is not shown in the drawings.

The inner diameter of this insertion hole 39 is equal to or slightly greater than the combined diameter of the lead wires 41 and 43, and a very small gap (or gaps) 45 is defined between the internal wall of the insertion hole 39 and the lead wires 41 and 43. This gap 45 effectively acoustically seals the sealed space 37 when the piezoelectric oscillating assembly 29 is being driven as explained hereinbelow, and on the other hand functions as a small but effective communication hole for relieving the sealed state of the space 37 by communicating with the outside so as to equalize the pressure in said space 37 with the exterior atmospheric pressure.

This piezoelectric transducer is used with its support portion 47 which is constituted by the superposed sandwich assembly of the flange 33 of the first oscillating plate 29 and the second oscillating plate 35 being directly mounted over a depression formed in case or chassis 49 for electrical equipment or the like.

And, when a drive signal is applied by the drive circuit (not shown) between the shown electrode 23 of the piezoelectric oscillating element 25 and the electroconductive plate 27, then the piezoelectric oscillating element 25 undergoes a bending oscillation and by way of the thus produced overall oscillation of the piezoelectric oscillating assembly 19 the first oscillating plate 29 also oscillates.

Since the acoustic sealed space 37 defined by the first and the second oscillating plates 29 and 35 is defined on the upper side in FIG. 1 of the piezoelectric oscillating assembly 19, the second oscillating plate 35 oscillates following after the oscillation of first oscillating plate 29.

Figure 20:
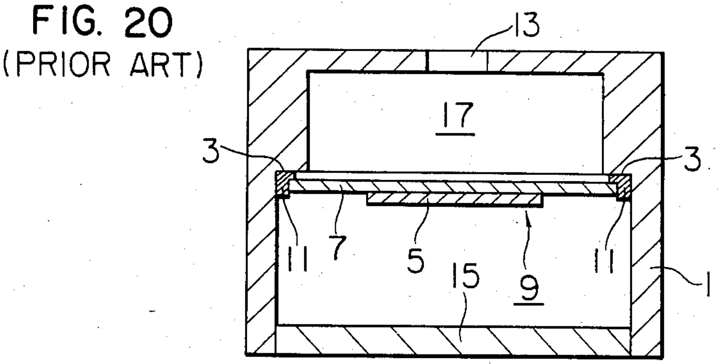
FIG. 20 (PRIOR ART)
FIG. 20, which relates to the prior art, is a sectional view of a conventional piezoelectric transducer.
Figure 21:
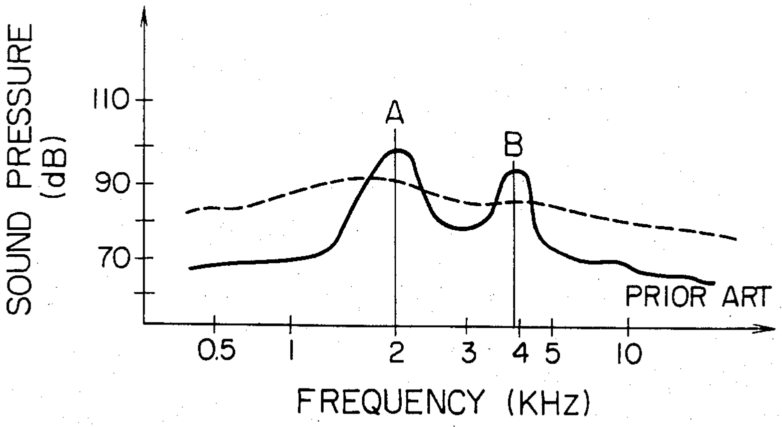
FIG. 21, which relates to the prior art and also to the present invention, shows by the solid line an exemplary frequency property graph of the prior art piezoelectric transducer of FIG. 20, and also schematically illustrates by the broken line a more desirable frequency property graph such as may be obtained by the various embodiments of the present invention described.

In this case, since it is not likely that the characteristic resonance frequencies of the piezoelectric oscillating assembly 19 and of the first and the second oscillating plates 29 and 35 should be in agreement, the characteristic resonance frequencies are increased in number as compared with the case of the prior art discussed hereinbefore and illustrated in FIGS. 20 and 21. Further, since the acoustically sealed space 37 functions so as to slightly reduce the sound pressure levels of the piezoelectric oscillating assembly 19 and of the first and the second oscillating plates 29 and 35 at their characteristic resonance frequencies, thereby the frequency property is in a manner of speaking leveled out over a wider range; and, since the characteristic resonance frequencies may be easily varied by changing the thicknesses and the shapes of the piezoelectric oscillating assembly 19 and of the first and the second oscillating plates 29 and 35, it can be satisfactorily ensured that the frequency property is appropriate.

Therefore the overall frequency characteristics can come closer to a flat state, as schematically shown by the broken line in FIG. 21, and, even when the piezoelectric oscillating element 25 is used as a piezoelectric speaker and a drive signal which varies over a wide frequency range is supplied thereto, it is possible to obtain a practical and usable sound pressure level over a relatively wide frequency range, and the reproduced sound is crisper.

Since the second oscillating plate 35 is directly adhered to the first oscillating plate 29 which is in turn adhered to the piezoelectric oscillating assembly 19 which is itself of a plate shape, as compared to the above discussed prior art the structure is simplified and is made more compact, and in particular is made more low profiled. For instance, one can make a piezoelectric speaker having a thickness of from 1.5 mm to 2 mm using as material for the first and the second oscillating plates 29 and 35 pieces of a plate material having a thickness of about 0.1 mm and a diameter of about 30 mm, and using a piezoelectric oscillating assembly 19 having a thickness of about 0.1 mm and a diameter of about 20 mm.

Furthermore, since the piezoelectric oscillating assembly 19 is located inside the sealed space 37, said piezoelectric oscillating assembly 19 is kept isolated and protected from the influences of moisture and dust from outside, and its operational property can remain stable over an extended service life.

When the piezoelectric oscillating assembly 19 is not being driven, the sealed space 37 is kept at substantially atmospheric pressure by the gap 39 communicating said space 37 with the outside. Therefore, even when the piezoelectric transducer is placed in an environment where the pressure fluctuates, for instance during transportation, the sealed space 37 will not be caused to expand or contract by such atmospheric pressure fluctuations, and the first and the second oscillating plates 29 and 35 will not be subjected to changes in shape or to damage by pressure differential between the atmosphere and the gas in the space 37.

In the above described piezoelectric oscillating assembly 19, the electroconductive plate 27 is not indispensable, but it is also possible to build a structure therefor using only the piezoelectric oscillating element 25, and further it becomes possible to obtain an even greater sound pressure by adhering a pair of piezoelectric oscillating bodies on both surfaces of the first oscillating plate 29 so as to achieve a bimorphic structure. The first and the second oscillating plates 29 and 35 may be implemented by using materials suitable for making an oscillating cone for a loudspeaker such as paper.

The piezoelectric transducer of this invention may have lead wire structures for connecting the piezoelectric oscillating element 25 to a drive circuit other than the lead wires 41 and 43 described above.

Figure 6:
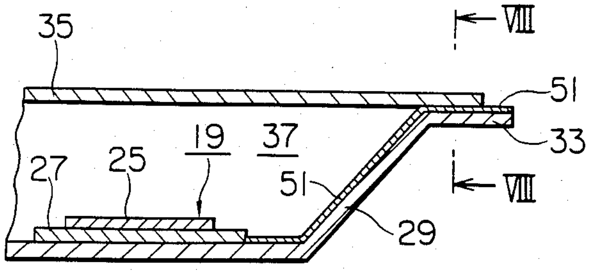
FIG. 6 is a partial longitudinal sectional view, showing another possible structure for leading out the lead wires in a variant of the piezoelectric transducer shown in FIG. 1.
Figure 7:
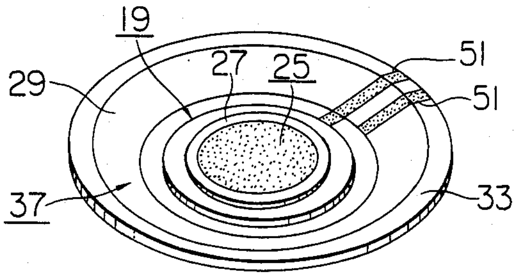
FIG. 7 is a perspective view showing the structure for leading out the lead wires in the piezoelectric transducer of FIG. 6.

For instance, as shown in the sectional view of FIG. 6 and the perspective view of FIG. 7, the first oscillating plate 29, which is adhered to the piezoelectric oscillating assembly 19, may be provided with a lead pattern 51 (instead of using the separate lead wires 41 and 43) extending from the vicinity of the piezoelectric oscillating assembly 19 to the flange 33, said pattern 51 being formed by photoetching or some other conventional method, and the piezoelectric oscillating assembly 19 may be connected to this lead pattern 51 by a connecting lead wire structure.

Figure 8:
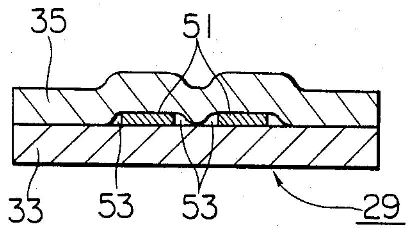
FIG. 8 is a sectional view taken in a plane indicated in FIG. 6 by the arrows VIII—VIII, showing the structure for leading out the lead wires in the piezoelectric transducer of FIG. 6.

According to a piezoelectric transducer of this modified structure, the productivity of assembly labor is increased, because the labor required for pulling the lead wires 41 and 43 through the insertion hole 39 may be eliminated. Further, as shown in the sectional view of FIG. 8, the lead pattern 51 generally protrudes from the surface of the first oscillating plate 29, and a gap 53 is generated in the vicinity of the flange portion 33 of the first oscillating plate 29 in the area surrounded by the lead pattern 51 and the first and the second oscillating plates 29 and 35. This gap 53 functions as the communication hole, like the gap 53 of the first structure for the transducer as shown in FIGS. 1 through 5.

Although such a structure is not particularly shown in the drawings, in the piezoelectric transducer of FIG. 1, the lead wires 41 and 43 may be led out from the laid over portion of the flange 33 of the first oscillating plate 29 and the second oscillating plate 35 by defining a communication hole thereby. And, as another alternative, the insertion hole may be formed in the second oscillating plate 35, and it is also possible to define such an insertion hole by piercing the first or the second oscillating plate 29 or 35 with a fine wire.

Figure 9:
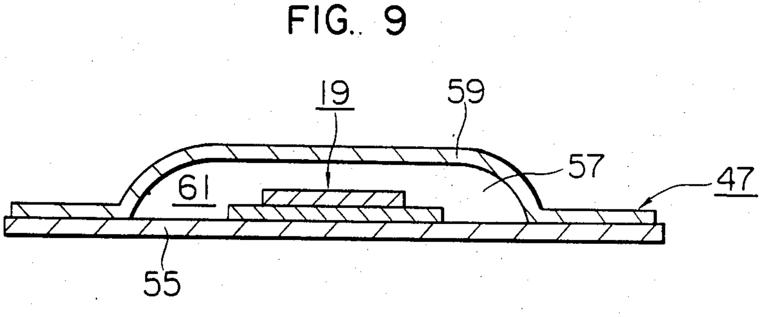
FIG. 9 is a sectional view showing a second preferred embodiment of the piezoelectric transducer according to the present invention.
Figure 10:
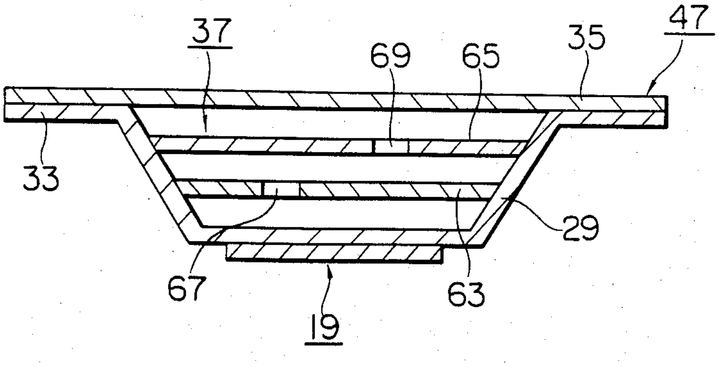
FIG. 10 is a sectional view of a third preferred embodiment of the piezoelectric transducer according to the present invention.

FIGS. 9 and 10 are longitudinal sectional views, similar to FIG. 1 for the first embodiment, showing the second and the third preferred embodiments of the piezoelectric transducer of the present invention.

According to the piezoelectric transducer shown in FIG. 9, as opposed to the first embodiment shown in FIG. 1, the piezoelectric oscillating assembly 19 is adhered over the flat and circular disk shaped first oscillating plate 55, and the piezoelectric oscillating assembly 19 is then covered by laying the second oscillating plate 59 having the depression 57 formed in it over said first oscillating plate 55 with a sealed space 61 being thereby defined between the first oscillating plate 55 and the second oscillating plate 59.

Thus, according to the piezoelectric transducer of this invention, the sealed space 61 may be formed either by using the second oscillating plate 59 having the depression 57 or by using the first and the second oscillating plates both having depressions. Essentially, it suffices if the first and the second oscillating plates are laid over each other, i.e. are sandwiched together, so as to define a sealed space on the front surface, the rear surface, or both the surfaces of the piezoelectric oscillating assembly 19.

In the piezoelectric transducer shown in FIG. 10, the sealed space 37 is divided in layers further by the third and the fourth oscillating plates 63 and 65, this embodiment otherwise having the same structure as that shown in FIG. 1. In this case, the sealed space 37 is located on the rear surface side of the piezoelectric oscillating assembly 19.

According to such a piezoelectric transducer, since the third and the fourth oscillating plates 63 and 65 having different characteristic resonance frequencies are added to the characteristic curve, in addition to the first and the second oscillating plates 29 and 35, the overall frequency property of the piezoelectric transducer as a whole may be made even more flat than that which is obtained with the FIG. 1 construction.

In order to assure the proper oscillation of the second oscillating plate 35, it is preferable to form sound emitting holes 67 and 69 in the third and the fourth oscillating plates 63 and 65 and to offset the relative position of the sound emitting holes 67 and 69. These holes, as in the previously described embodiments, serve for equalizing the pressures in the chambers defined between the various oscillating plates.

Figure 11:
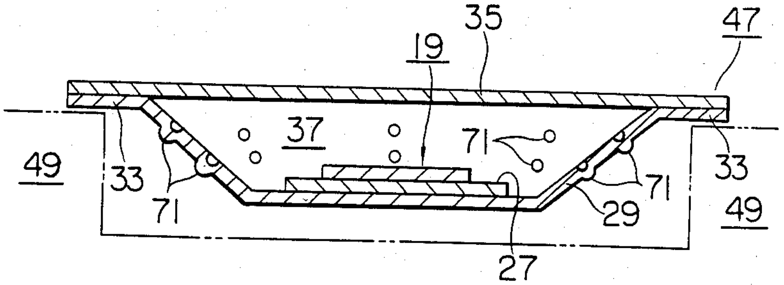
FIG. 11 is a sectional view of a fourth preferred embodiment of the piezoelectric transducer according to the present invention.

FIG. 11 shows the fourth preferred embodiment of the piezoelectric transducer of the present invention.

This embodiment is similar to the first preferred embodiment shown in FIG. 1, except for the fact that the portion defining the depression 31 in the first oscillating plate 29 is provided with a plurality of protrusions protruding to the outside from the sealed space 37, i.e. a large number of outwardly bent dot portions 71 in a distributed relationship. These protruding bent portions 71 may be formed by pressing the first oscillating plate 29 with a tip of a wire without piercing it, and the wire may be applied from the outside to the sealed space 37, or pressure from both sides may be combined.

According to such a piezoelectric transducer, since the number of resonance points of the first oscillating plate 29 is increased as compared to the FIG. 1 case in which no bent portions 71 are formed, the frequency property may be made more flat as compared to that of the structure shown in FIG. 1. Since the resonance points produced in the characteristic curve of the first oscillating plate 29 change as the positions, the number, and the spacing of the protruding bent portions 71 formed in said first oscillating plate 29 are varied, the adjustment of the overall frequency property is possible with the use of these bent portions 71.

Figure 12:
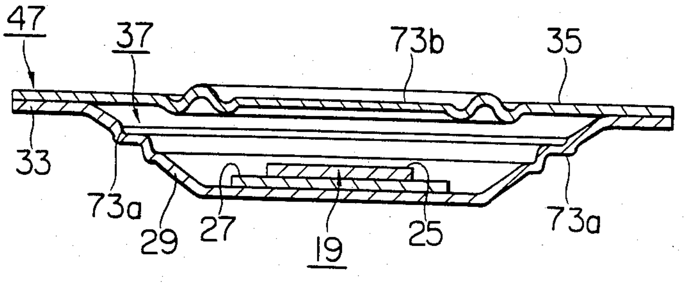
FIG. 12 is a sectional view showing a variation of the piezoelectric transducer of FIG. 11.
Figure 13:
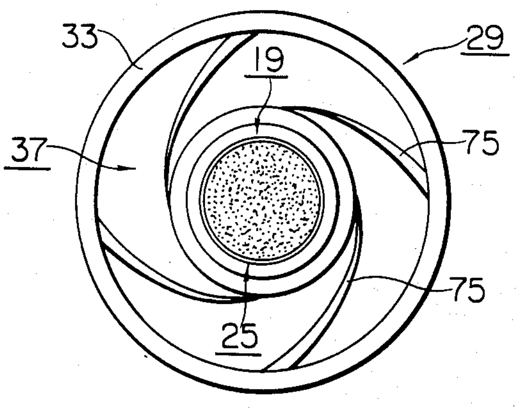
FIG. 13 is a partial plan view showing yet another variation of the piezoelectric transducer of FIG. 11.

FIGS. 12 and 13 show variations of the piezoelectric transducer of FIG. 11.

According to the piezoelectric transducer shown in FIG. 12, bent portions 73*a*, 73*b* with wave shaped cross sections are formed in the portions of the first and the second oscillating plates 29 and 35 defining the sealed space 37 by forming annular concentric wrinkles therein.

According to such a piezoelectric transducer of this invention, since not only are the bent portions 73*a* formed in the first oscillating plate 29 but also the other bent portions 73*b* are formed in the second oscillating plate 35, thereby the number of resonance points in the characteristic curves of each of the first and the second oscillating plates 29 and 35 are drastically increased, and an even more flat frequency property becomes readily possible.

Figure 14:
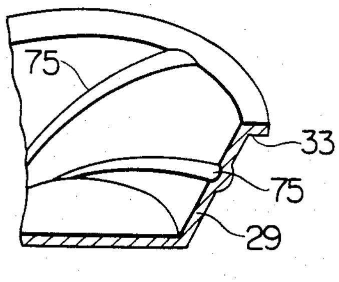
FIG. 14 is a partial perspective view of FIG. 13.

As for the bent portions, as an alternative to the annular shapes therefor shown in FIG. 12, they may be constituted by spiral shaped bent portions 75 formed in the first oscillating plate 29 in the form of curved wrinkles facing away from the piezoelectric oscillating assembly 19 as shown in FIG. 13 (only the first oscillating plate 29 is shown in this figure) and FIG. 14 (the piezoelectric oscillating assembly 19 is not shown in this FIG. 14). The bent portions may also consist of spirals facing the piezoelectric oscillating assembly 19, although this alternative concept is not shown in the drawings. Thus, the objects of this invention may be achieved, no matter whether the bent portions are protrusions or wrinkles, as long as they are formed in the portions of the first and the second oscillating plates 29 and 35 which define the sealed space 37.

Figure 15:
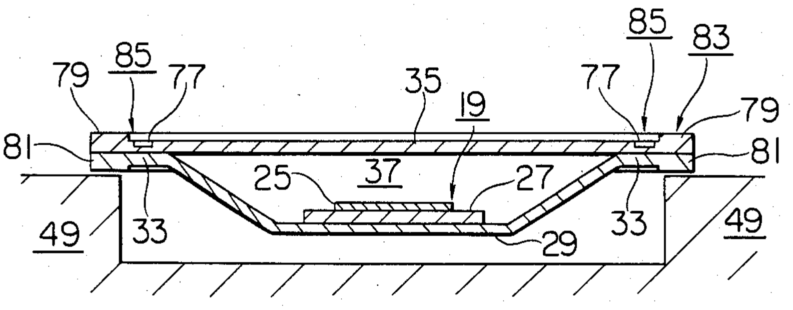
FIG. 15 is a sectional view showing a fifth preferred embodiment of the piezoelectric transducer according to the present invention.

FIG. 15 shows the fifth preferred embodiment of the piezoelectric transducer of the present invention.

The structure of this embodiment is similar to that of the first preferred embodiment shown in FIG. 1, except that the outer part of the laid over portions of the flange 33 of the first oscillating plate 29 and the second oscillating plate 35 is made as a somwhat thick support portion 83 for mounting the piezoelectric transducer as a whole to a chassis 49 for electronic or electrical equipment, and the somewhat inward portion of the second oscillating plate 35 in the vicinity of this support portion 83 is provided with an annular groove 77, which thins out this portion of the second oscillating plate 35.

Thus, the portions of the first and the second oscillating plates 29 and 35 which extend beyond the groove 77 are increased in thickness and define annular thick portions 79 and 81 which are to be mounted onto the chassis 49.

According to such a structure for the piezoelectric transducer, since the support portion 83 is increased in thickness and on its inward side the groove 77 is provided, the oscillation produced in the first and the second oscillating plates 29 and 35 is prevented from being transmitted to the outer edge portion of the support portion 83 or the edge portions of the first and the second oscillating plates 29 and 35, and therefore even when the thick portions 79 and 81 are fixedly secured to the chassis 49 the proper free oscillation of the first and the second oscillating plates 29 and 35 is assured. In other words, the change in the thickness of the first and the second oscillating plates 29 and 35 (including the groove 77) functions as a transmission preventing portion 85 which prevents oscillations produced either in the combination of first and the second oscillating plates 29 and 35 or in the chassis 49 from being transmitted to the other one thereof. The groove 77 functions as part of the transmission preventing portion but is not indispensable.

As a result, according to such a piezoelectric transducer of this structure, in particular, the sound pressure in low frequency range, for instance from 400 to 500 Hz, is increased as compared to the case of the first preferred embodiment shown in FIG. 1. Furthermore, because of the presence of the transmission preventing portion 85, even when the electrical equipment to which the piezoelectric transducer is attached is changed, the frequency properties of the piezoelectric transducer is not substantially altered; in other words, the frequency properties of said piezoelectric transducer by itself in the unmounted condition, and in the mounted condition, are not different from each other to any appreciable degree.

Figure 16:
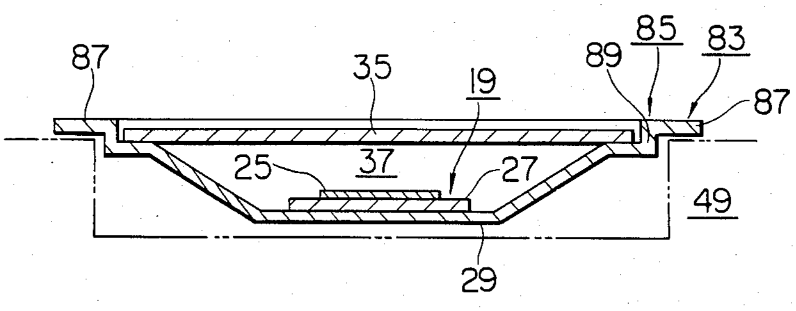
FIGS. 16 to 18 are sectional views showing variations of the piezoelectric transducer of FIG. 15.
Figure 17:
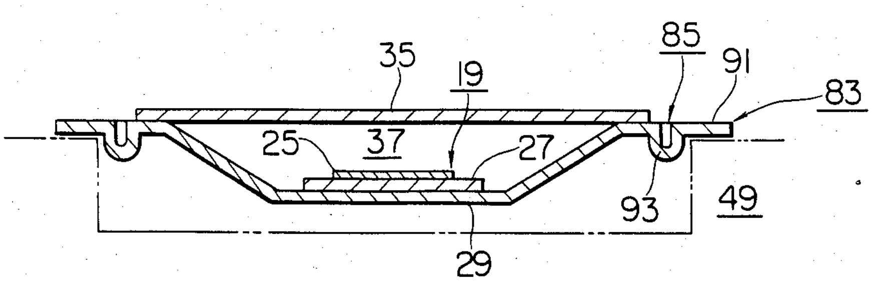
Figure 18:
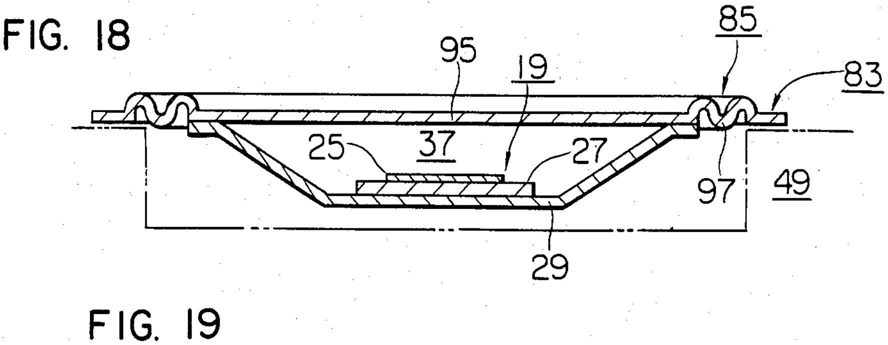

The transmission preventing portion 85 which restricts the transmission of oscillation may be formed, as an alternative to varying the thickness of the support portion 83 constituted by portions of the first and second oscillating plates 29 and 35, by forming bent portions in the support portion 83 of the piezoelectric transducer, as shown in FIGS. 16 to 18.

In other words, in the FIG. 16 structure, the flange 87 of the first oscillating plate 29 forms a support portion 83 which extends beyond the second oscillating plate 35 and thence forms a step portion 89 by rising up in a cranked shape (in cross sectional view; actually this shape is an annular step shape), whereby the transmission preventing portion 85 is formed.

On the other hand, in the FIG. 17 structure, the flange 91 of the first oscillating plate 29 extending beyond the second oscillating plate 35 is provided with an annular bent crease portion 93 having a U-shaped cross section, and this bent crease portion 93 constitutes the transmission preventing portion 85.

In the FIG. 18 structure, by contrast, the second oscillating plate 95 forms a support portion 83 extending beyond the flange 33 of the first oscillating plate 29, and an annular wave shaped bent portion 97 is formed in the second oscillating plate 95 so as to define the transmission preventing portion 85 so that the annular edge portion beyond the bent portion 97 may be fixedly attached to the chassis 49.

It should be noted that, further, the support portions 47 and 83 in the above described piezoelectric transducers according to this invention may not be formed over the whole peripheral length, but may be formed partially therein.

Figure 19:
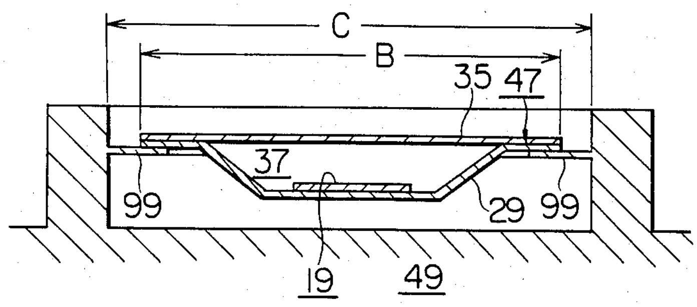
FIG. 19 is a sectional view showing an example of the manner in which the piezoelectric transducer of FIG. 1 is supported.

As a structure for fixedly supporting the piezoelectric transducer of this invention onto the chassis 49 of electronic equipment and so on, when an oscillating piece 99 is extended from the chassis 49, and the support portion 47 of a piezoelectric transducer such as for example the one shown in FIG. 1 is fixedly placed on the oscillating piece 99, as schematically shown in FIG. 19, not only the piezoelectric oscillating assembly 19 but also the oscillating piece 99 oscillates, whereby the oscillating range is expanded from the range B provided only by the piezoelectric transducer to the range indicated by C which includes the aforementioned oscillating piece 99, and the sound pressure in the high frequency range is slightly restrained, while the sound pressure in the low frequency range is raised. Furthermore, since the sound pressure in the low frequency range may be increased without increasing the size of the piezoelectric oscillating assembly 19, the cost of the piezoelectric oscillating assembly 19 is not increased.

Because generally the impact and the oscillation which may be applied to the chassis are not the same as those of the piezoelectric oscillating assembly 19, even when such impacts and oscillations are applied to the chassis 49 the oscillating piece 99 absorbs such impacts and oscillations by preventing the transmission thereof to the piezoelectric oscillating assembly 19, thereby reducing the possibility of unfavorable influence on the oscillation of the piezoelectric oscillating assembly 19.

The piezoelectric transducer may be fixedly supported not only by fixedly placing the support portion 47 onto the oscillating piece 99 of the chassis 49 but also by interposingly securing the oscillating piece 99.

Because in the application of the piezoelectric transducer of this invention the frequency properties of the piezoelectric transducer as it is mounted include the properties of the acoustic space defined between the second oscillating plate 35 and the electronic equipment to which the piezoelectric transducer is mounted, the second oscillating plate 35 may be considered to be functioning as a plane sound source with respect to the outside. Therefore, the structure of the electronic equipment, particularly the structure of the case or the chassis to which the piezoelectric transducer is to be mounted, may be arbitrary.

The above described piezoelectric transducer according to this invention has been described in an exemplary fashion by considering the case of a piezoelectirc loudspeaker for the convenience of description, but the present invention in fact may be applied not only to a piezoelectric speaker but also to a piezoelectric microphone, a piezoelectric buzzer, and so on. When a piezoelectric transducer according to the present invention is to be used as a piezoelectric microphone, in the structure shown in FIG. 1, the first oscillating plate 29 oscillates by being driven by the oscillation of the second oscillating plate 35, and an electrical output signal is outputted from the piezoelectric oscillating assembly 19.

Although the present invention has been shown and described with reference to the preferred embodiments thereof, and in terms of the illustrative drawings, it should not be considered as limited thereby, since various possible modifications, omissions, and alterations could be conceived of by one skilled in the art to the form and the content of any particular embodiment, without departing from the scope of the present invention. Therefore it is desired that the scope of the present invention should be defined solely by the scope of the appened claims, which follow.

What is claimed is:

1. A piezoelectric transducer comprising:

(a) a piezoelectric oscillating assembly comprising a piezoelectric oscillating element comprising a thin piezoelectric plate and electrodes attached to the opposing surfaces of said thin piezoelectric plate;

(b) a first oscillating plate, which is greater in diameter than said piezoelectric oscillating assembly, to which said piezoelectric oscillating assembly is adhered;

(c) a second oscillating plate, which is laid over said first oscillating plate with the edges thereof substantially sealed together so as to define an acoustically sealed sapce therebetween; and (d) a support portion defined by said laid over and sealed together portions of said first and said second oscillating plates, the edge portion of said support portion being defined by at least the edge portion of said first or said second oscillating plate, wherein the piezoelectric oscillating element is located between said first oscillating plate and said second oscillating plate.

2. A piezoelectric transducer according to claim 1, wherein said first and said second oscillating plates define said sealed space by virtue of a depression formed at least in one of said first and said second oscillating plate.

3. A piezoelectric transducer according to claim 2, wherein a bent portion is formed at least in the portion of said first or said second oscillating plate which forms said depression.

4. A piezoelectric transducer as claimed in claim 1, wherein said support portion comprises a transmission preventing means for preventing the transmission of vibrations from a portion of at least one of the oscillating plates located radially inside the transmission preventing means to a portion of at least one of the oscillating plates located radially outside the transmission preventing means.

5. A piezoelectric transducer comprising:

a piezoelectric oscillating assembly comprising a piezoelectric oscillating element comprising a thin piezoelectric plate and electrodes attached to the opposing surfaces of said thin piezoelectric plate;

a first oscillating plate, which is greater in diameter than said piezoelectric oscillating assembly, to which said piezoelectric oscillating assembly is adhered;

a second oscillating plate, which is laid over said first oscillating plate with the edges thereof substantially sealed together so as to define an acoustically sealed space therebetween;

a support portion being defined by said laid over and sealed together portions of said first and said second oscillating plates, the edge portion of said support portion being defined by at least the edge portion of said first or said second oscillating plate;

a depression formed in at least one of said first and said second oscillating plates, thereby to form said acoustically sealed space; and at least one dividing wall which separates said depression formed in said one of said first and said second oscillating plate into a plurality of layers.

6. A piezoelectric transducer according to claim 5, further comprising a communication hole formed either in said first oscillating plate or said second oscillating plate for maintaining said sealed space at the same pressure as the outside atmosphere.

7. A piezoelectric transducer according to claim 6, wherein a bent portion is formed at least in the portion of said first or said second oscillating plate which forms said depression.

8. A piezoelectric transducer according to claim 6, wherein a transmission preventing portion for preventing the transmission of oscillation is formed in said support portion.

9. A piezoelectric transducer comprising:

a piezoelectric oscillating assembly comprising a piezoelectric oscillating element comprising a thin piezoelectric plate and electrodes attached to the opposing surfaces of said thin piezoelectric plate;

a first oscillating plate, which is greater in diameter than said piezoelectric oscillating assembly, to which said piezoelectric oscillating assembly is adhered;

a second oscillating plate, which is laid over said first oscillating plate with the edges thereof substantially sealed together so as to define an acoustically sealed space therebetween;

a support portion being defined by the aforesaid laid over and sealed together portions of said first and said second oscillating plates, the edge portion of said support portion being defined by at least the edge portion of said first or said second oscillating plate;

a depression formed at least in one of said first and said second oscillating plate, thereby to form said acoustically sealed space; and a communication hole formed in at least one of said first oscillating plate or said second oscillating plate for maintaining said sealed space at the same pressure as the outside, said communication hole being small enough that essentially no sound waves produced by said oscillating element escape therethrough.

10. A piezoelectric transducer according to claim 9, wherein a bent protion is formed at least in the portion of said first or said second oscillating plate which forms said depression.

11. A piezoelectric transducer according to claim 9, wherein a transmission preventing portion for preventing the transmission of oscillation is formed in said support portion.

12. A piezoelectric transducer comprising:

(a) a piezoelectric oscillating assembly comprising a piezoelectric oscillating element comprising a thin piezoelectric plate and electrodes attached to the opposing surfaces of said thin piezoelectric plate;

(b) a first oscillating plate, which is greater in diameter than said piezoelectric oscillating assembly, to which said piezoelectric oscillating assembly is adhered;

(c) a second oscillating plate, which is laid over said first oscillating plate with the edges thereof substantially sealed together so as to define an acoustically sealed space therebetween;

(d) a support portion defined by said laid over and sealed together portions of said first and said second oscillating plates, the edge portion of said support portion being defined by at least the edge portion of said first or said second oscillating plate; and (e) a communication hole formed either in said first oscillating plate or said second oscillating plate for maintaining said sealed space at the same pressure as the outside atmosphere, said communication hole being small enough that essentially no sound waves produced by said oscillating element escape therethrough;

wherein the piezoelectric oscillating element is located between said first oscillating plate and said second oscillating plate.

* * * * *